(12) United States Patent
Li et al.

(10) Patent No.: US 10,658,409 B2
(45) Date of Patent: May 19, 2020

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Sheng-Chan Li, Tainan (TW); I-Nan Chen, Taipei (TW); Tzu-Hsiang Chen, Changhua County (TW); Yu-Jen Wang, Kaohsiung (TW); Yen-Ting Chiang, Tainan (TW); Cheng-Hsien Chou, Tainan (TW); Cheng-Yuan Tsai, Hsin-Chu County (TW)

(73) Assignee: TAIWAN SEMICONDUCTOR MANUFACTURING COMPANY LTD. U., Hsinchu (TW)

( * ) Notice: Subject to any disclaimer, the term of this patent is extended or adjusted under 35 U.S.C. 154(b) by 0 days.

(21) Appl. No.: 15/903,560

(22) Filed: Feb. 23, 2018

(65) Prior Publication Data
US 2019/0157322 A1 May 23, 2019

Related U.S. Application Data

(60) Provisional application No. 62/587,888, filed on Nov. 17, 2017.

(51) Int. Cl.
*H01L 27/146* (2006.01)
*H01L 21/763* (2006.01)
*H01L 21/762* (2006.01)

(52) U.S. Cl.
CPC ........ *H01L 27/1463* (2013.01); *H01L 21/763* (2013.01); *H01L 21/76224* (2013.01);
(Continued)

(58) Field of Classification Search
CPC ............. H01L 21/76237; H01L 21/763; H01L 21/76297; H01L 27/1463; H01L 27/14685; H01L 27/14687
See application file for complete search history.

(56) References Cited

U.S. PATENT DOCUMENTS

| 2007/0145516 A1* | 6/2007 | Lee | H01L 27/1463 |
| | | | 257/499 |
| 2008/0102557 A1* | 5/2008 | Kim | H01L 21/76224 |
| | | | 438/73 |

(Continued)

FOREIGN PATENT DOCUMENTS

| KR | 20040002137 A | 1/2004 |
| KR | 100801053 | 2/2008 |

(Continued)

OTHER PUBLICATIONS

Office Action and Search Report dated May 14, 2019 issued by Taiwan Intellectual Property Office for counterpart application No. 107120208.

(Continued)

*Primary Examiner* — Wael M Fahmy
*Assistant Examiner* — Sarah K Salerno
(74) *Attorney, Agent, or Firm* — WPAT, P.C., Intellectual Property Attorneys; Anthony King

(57) ABSTRACT

A semiconductor structure is disclosed. The semiconductor structure includes: a semiconductor substrate having a front surface and a back surface facing opposite to the front surface; a filling material extending from the front surface into the semiconductor substrate without penetrating through the semiconductor substrate, the filling material including an upper portion and a lower portion, the upper portion being in contact with the semiconductor substrate; and an epitaxial layer lined between the lower portion of the (Continued)

filling material and the semiconductor substrate. An associated manufacturing method is also disclosed.

20 Claims, 18 Drawing Sheets

(52) U.S. Cl.
CPC .. *H01L 27/14685* (2013.01); *H01L 27/14689* (2013.01); *H01L 21/76237* (2013.01); *H01L 27/14643* (2013.01)

(56) References Cited

U.S. PATENT DOCUMENTS

| | | | |
|---|---|---|---|
| 2013/0119460 A1* | 5/2013 | Lin | H01L 29/66348 257/330 |
| 2015/0014807 A1 | 1/2015 | Chuang et al. | |
| 2015/0130016 A1 | 5/2015 | Kao | |
| 2016/0163749 A1* | 6/2016 | Yang | H01L 27/1463 257/446 |
| 2017/0207270 A1* | 7/2017 | Chen | H01L 27/1463 |
| 2018/0286894 A1* | 10/2018 | Huang | H01L 27/1463 |

FOREIGN PATENT DOCUMENTS

| | | |
|---|---|---|
| KR | 20150007216 | 1/2015 |
| TW | 201212218 A | 3/2012 |

OTHER PUBLICATIONS

US20150014807 is the family patent for KR20150007216.
US20080102557 is the family patent for KR100801053.

* cited by examiner

SEMICONDUCTOR STRUCTURE AND METHOD OF MANUFACTURING THE SAME

CROSS REFERENCE TO RELATED APPLICATIONS

This application claims the benefit of U.S. provisional application 62/587,888, filed on Nov. 17, 2017, which is incorporated by reference in its entirety.

BACKGROUND

Image sensor chips, which include Front-Side Illumination (FSI) image sensor chips and Backside Illumination (BSI) image sensor chips, are widely used in applications such as cameras. In the formation of image sensor chips, image sensors (such as photo diodes) and logic circuits are formed on a silicon substrate of a wafer, followed by the formation of an interconnect structure on a front side of the wafer. In the FSI image sensor chips, color filters and micro-lenses are formed over the interconnector structure. In the formation of the BSI image sensor chips, after the formation of the interconnect structure, the wafer is thinned, and backside structures such as color filters and micro-lenses are formed on the backside of the wafer. In operation, light is projected on the image sensors and converted into electrical signals.

An image sensor chip often employs a large number of image sensors arranged in arrays. In the image sensor chips, deep trenches are formed in the silicon substrate to separate the image sensors from each other. The deep trenches are filled with dielectric materials, which may include an oxide, to isolate neighboring devices from each other.

The image sensors in the image sensor chips generate electrical signals in response to the stimulation of photons. The light received by one micro-lens and the underlying color filter, however, may be tilted. The tilted light may penetrate through the deep trench that is used to separate the image sensors. As a result, cross-talk occurs due to the interference of the light that is undesirably received from neighboring pixels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
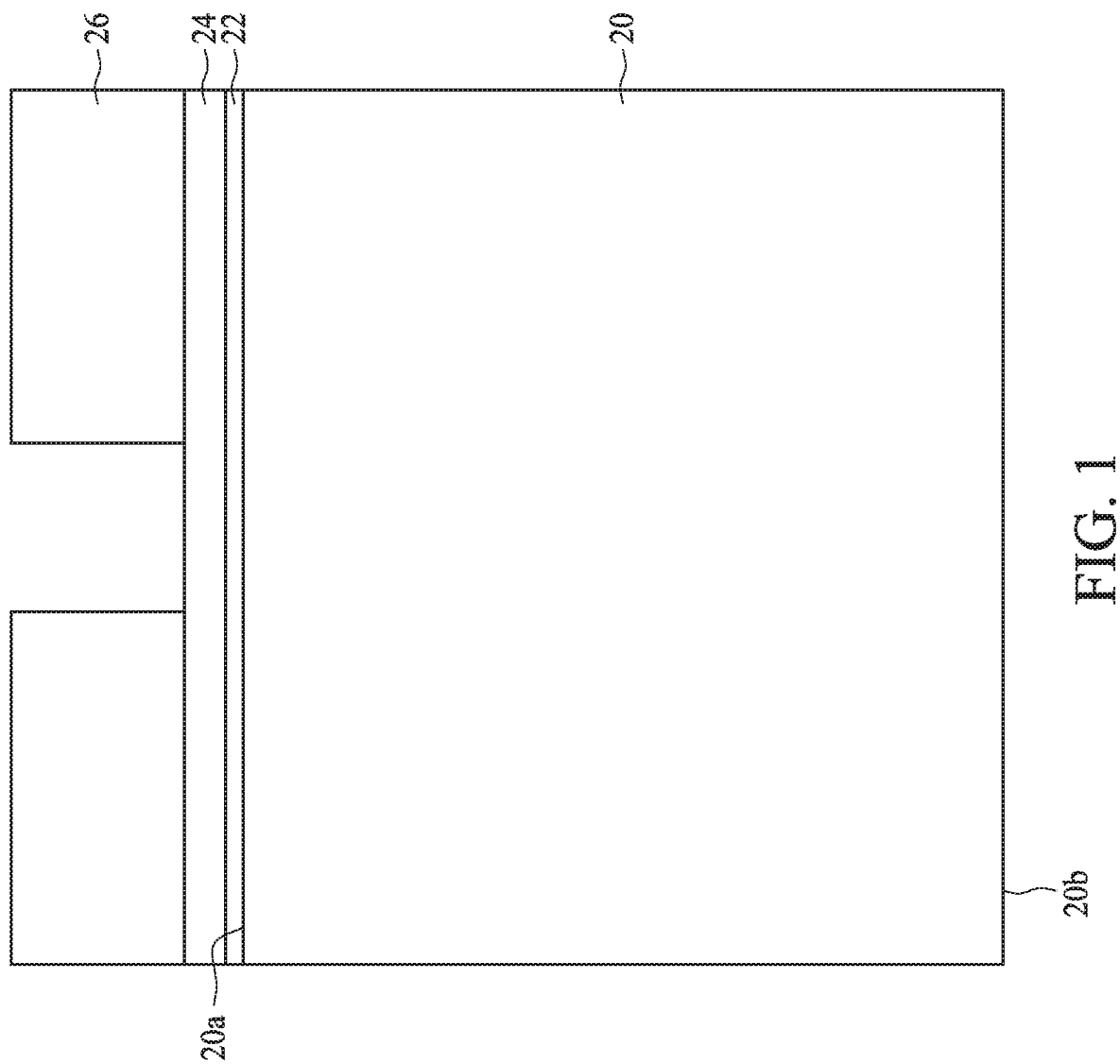
FIG. 1 to FIG. 17 illustrates the cross-sectional views of intermediate stages in the formation of a DTI structure in accordance with various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Deep Trench Isolation (DTI) structures and the methods of forming the same are provided in accordance with various exemplary embodiments. The intermediate stages of forming the DTI structures are illustrated. Some variations of embodiments are discussed. Throughout various views and illustrative embodiments, like reference numbers are used to designate like elements.

FIG. 1 to FIG. 8 illustrates the cross-sectional views of intermediate stages in the formation of a DTI structure in accordance with a first embodiment of the present disclosure. The DTI structure may be used in image sensor chips, for instance, Front-Side Illumination (FSI) image sensor chips. Referring to FIG. 1, a semiconductor substrate 20 is provided. The semiconductor substrate 20 includes a front surface 20a and a back surface 20b opposite to the front surface 20a. The semiconductor substrate 20 may include, for example, bulk silicon, doped or undoped, or an active layer of a Semiconductor-On-Insulator (SOI) substrate.

Generally, an SOI substrate includes a layer of a semiconductor material, such as silicon, formed on an insulator layer, The insulator layer may be, for example, a buried oxide (BOX) layer or a silicon oxide layer. The insulator layer is provided on a substrate, such as silicon or a glass substrate. Alternatively, the semiconductor substrate 20 may include another elementary semiconductor, such as germanium; a compound semiconductor including silicon carbon, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In accordance with some embodiments, a pad layer 22 and a mask layer 24 may be formed on the semiconductor substrate 20. The pad layer 22 may be a thin film comprised of silicon oxide formed, for example, using a thermal oxidation process or Chemical Vapor Deposition (CVD). A thickness of the pad layer 22 may be between about 10 angstroms and about 100 angstroms. It is appreciated, however, that the values recited throughout the description are merely examples, and may be changed to different values. The pact layer 22 may act as an etch stop layer for etching the mask layer 24. In accordance with some embodiments, the mask layer 24 may be formed of silicon nitride, for example, using Low-Pressure Chemical Vapor Deposition (LPCVD). In accordance with other embodiments, the mask layer 24 may be formed using thermal nitridation of silicon, Plasma Enhanced Chemical Vapor Deposition (PECVD), or the like. A thickness of the mask layer 24 may be between about 100 angstroms and about 1,000 angstroms. The mask layer 24 may be used as a hard mask during subsequent photolithography processes. In some embodiments, the mask layer 24 may also act as a bottom anti-reflective coating. After the pad layer 22 and the mask layer 24 are formed, a photo resist 26 may be formed on the mask layer 24 and is then defined according to a desired DTI pattern to form a DTI structure.

Figure 2:
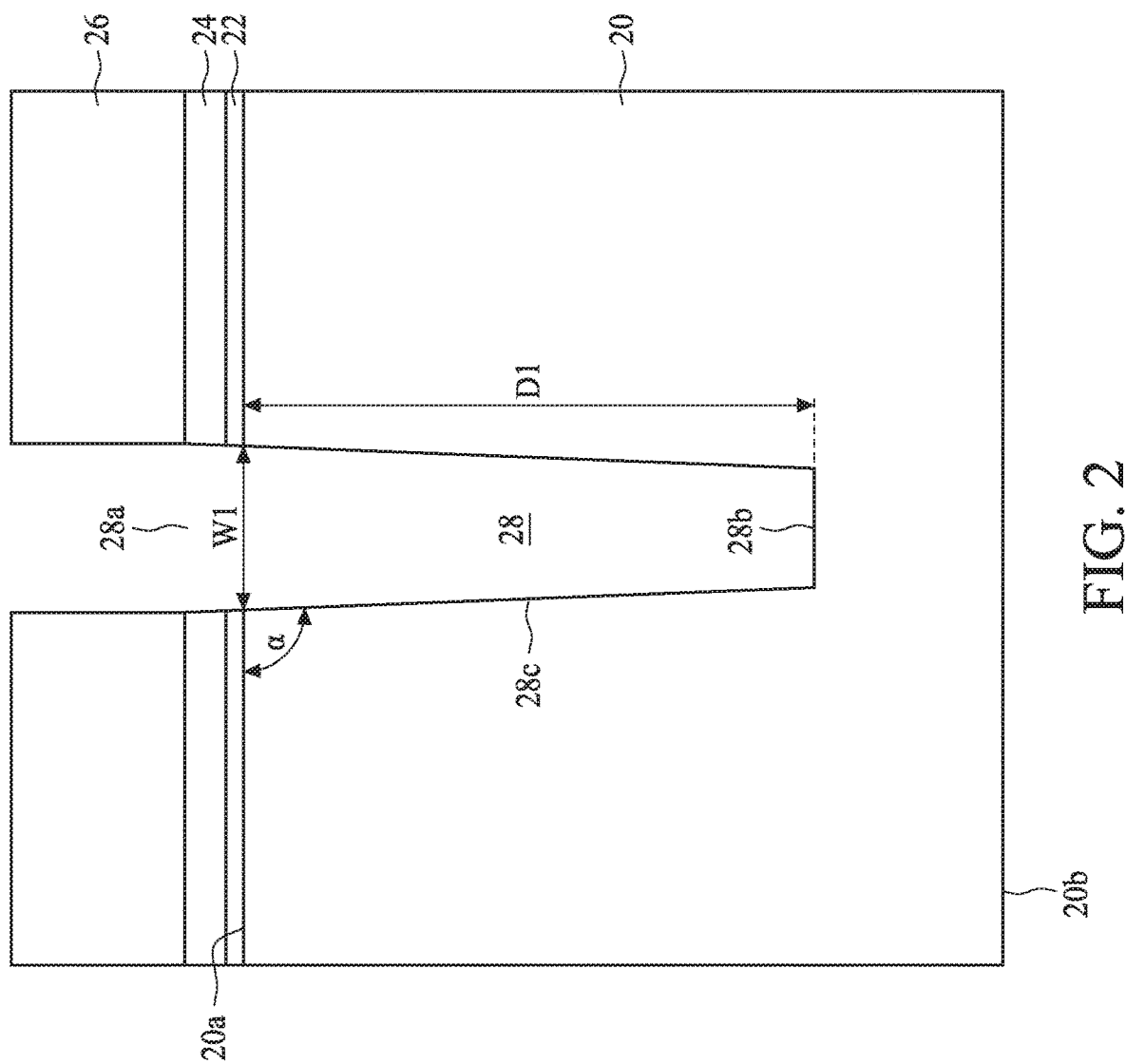

Next, referring to FIG. 2, the photo resist 26 is used as an etching mask to etch the underlying mask layer 24, and the mask layer 24 is used as an etching mask to etch the underlying layers. Accordingly, a deep trench 28 is formed through the hard mask layer 24, the pad layer 22, and further extends into the semiconductor substrate 20. The deep trench 28 extends from the front surface 20a into the semiconductor substrate 20. A bottom of the deep trench 28 is between the front surface 20a and the back surface 20b of the semiconductor substrate 20. In some embodiments, the bottom of the deep trench 28 is at an intermediate level between the front surface 20a and the back surface 20b of the semiconductor substrate 20.

In some embodiments, the etch process may be performed through an anisotropic etch, so that sidewalls 28c of the deep trench 28 may be substantially straight and vertical. In other words, the sidewalls 28c are substantially perpendicular to the front surface 20a and the hack surface 20b. However, this is not a limitation of the present disclosure. In many instances, there may be process variations, causing the deep trench 28 to be slightly tapered, and hence the sidewalls 28c of the deep trench 28 are not exactly perpendicular to the front surface 20a and the back surface 20b. For example, a slight tilt angle may exist and cause an angle a between the sidewalls 28c of the deep trench 28 and the front surface 20a to be greater than about 90 degrees, as indicated in FIG. 2.

Figure 3:
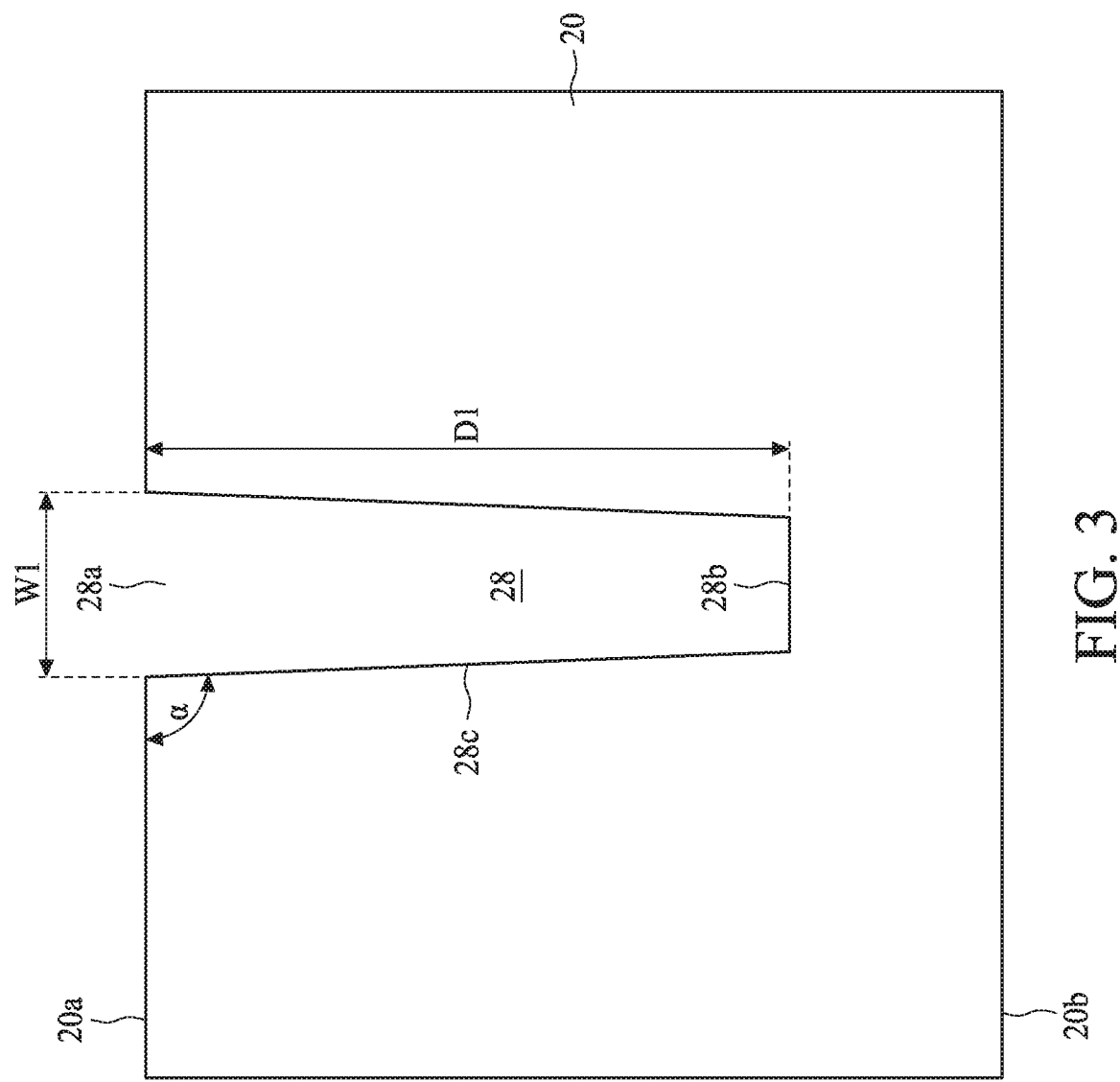

In accordance with some exemplary embodiments, the etch process is performed through a dry etch method including, but not limited to, inductively coupled plasma (ICP), transformer coupled plasma (TCP), electron cyclotron resonance (ECR), reactive ion etch (RIE), and the like. The process gases include, for example, fluorine-containing gases (such as $SF_6$, $CF_4$, $CHF_3$, $NF_3$), Chlorine-containing gases (such as $Cl_2$), $Br_2$, HBr, $BCl_3$ and/or the like. After the formation of the deep trench 28, the photo resist 26 (if any left), the hard mask layer 24, and the pad layer 22 may be removed as shown in FIG. 3.

In accordance with some exemplary embodiments, aspect ratio D1/W1 of the deep trench 28 may be greater than about 10 or higher, wherein D1 is a depth of the deep trench 28, and W1 is a width of an opening 28a of the deep trench 28. In some embodiments, the aspect ratio D1/W1 of the deep trench 28 may be in a range from about 20 to about 100, in some embodiments, the depth D1 of the deep trench 28 may be in a range from about 6 μm to about 10 μm. In some embodiments, the width W1 of the opening 28a of the deep trench 28 may be in a range from about 0.1 μm to about 0.3 μm. In some embodiments, there may be process variations, and a bottom surface 28b of the deep trench 28 may be rounded and have a U-shape in the cross-sectional view. The rounded portion may be curved smoothly all the way from the sidewall 28c of the deep trench 28 to the sidewall 28c on the opposite side of the deep trench 28.

A cleaning process may be performed after the etch process. The cleaning may be a wet clean using ST250 (a trademark of ATMl Incorporated) solvent, for example. The cleaning may, or may not, cause a thin surface layer of semiconductor substrate 20 that is exposed to the deep trench 28 to be removed. In some embodiments, the bottom surface 28b of the deep trench 28 may remain to be rounded and curved after the cleaning process.

In some embodiments, due to the bombardment effect of the dry etch process in the formation of the deep trench 28, the surface layer of the semiconductor substrate 20 is damaged. The damaged portion may be the surface layer that is exposed from the deep trench 28, and at least some portions of the damaged surface layer may be left after the cleaning process. The damage may further be caused by the penetration of the atoms (such as carbon atoms) in the process gases (used in forming the deep trench 28) into the surface layer. The damage may include atom displacement, vacancy, and/or the like. The damaged surface layer may generate defects in the resulting DTI structure, which may lead to the increase of dark currents of image sensor pixels. The damaged surface layer may also cause the increase in white pixels, which are the pixels generating currents when not exposed to light. Accordingly, a damage removal process may be performed to remove (or at least reduce) the damaged surface layer. After the damage removal process, at least most of (and possibly all) the displacements, vacancies, and the like can be removed.

The damage removal process may include a wet etch, which may be performed using an alkaline-containing (base-containing) solution. In accordance with some embodiments, Tetra-Methyl Ammonium Hydroxide (TMAH) is used in the damage removal process. In accordance with alternative embodiments, the solution of $NH_4OH$, potassium hydroxide (KOH) solution, sodium hydroxide (NaOH), or the like is used to remove the damaged surface layer. The thickness of the removed surface layer may be greater than about 50 nm, and may be in the range between about 50 nm and about 135 nm.

Figure 4:
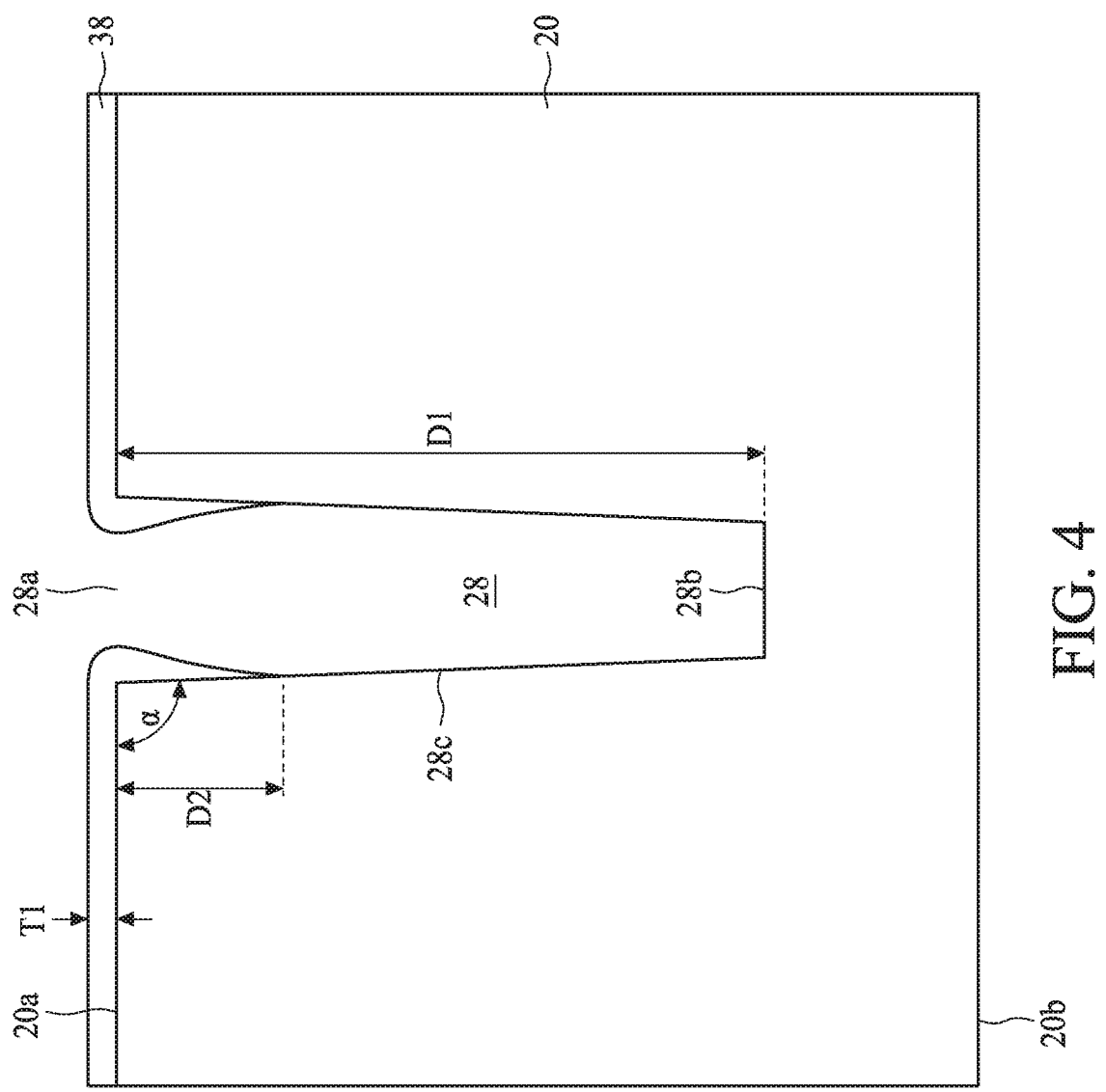

FIG. 4 illustrates the formation of an oxide layer 38. In accordance with some embodiments of the present disclosure, the oxide layer 38 may be comprised of silicon oxide (SiO$_2$), and the oxide layer 38 may be deposited through a low deposition rate process such as Plasma Enhanced Chemical Vapor Deposition (PECVD) or the like. The oxide layer 38 may be deposited to cover the front surface 20a of the semiconductor substrate 20 and further extend into the deep trench 28 to cover at least a portion of the sidewalk 28c of the deep trench 28. The oxide layer 38 may be non-conformal and may form an overhang shape around the opening 28a of the deep trench 28. A thickness T1 of the oxide layer 38 measured at the horizontal portion of the oxide layer 38 over the front surface 20a of the semiconductor substrate 20 may be in the range between about 200 angstroms and about 800 angstroms. According to an exemplary embodiment, the thickness T1 of the oxide layer 38 measured at the horizontal portion of the oxide layer 38 over the front surface 20a of the semiconductor substrate 20 may be about 500 angstroms. A thickness of the oxide layer 38 covering the sidewalls 28c of the deep trench 28 may gradually reduce from the opening 28a of the deep trench 28 toward the bottom surface 28b of the deep trench 28, as shown in FIG. 4. In some embodiments, the oxide layer 38 extends to a depth D2 from the front surface 20a of the semiconductor substrate 20. The depth D2 may be in a range from about 3000 angstroms to about 6000 angstroms.

Figure 5:
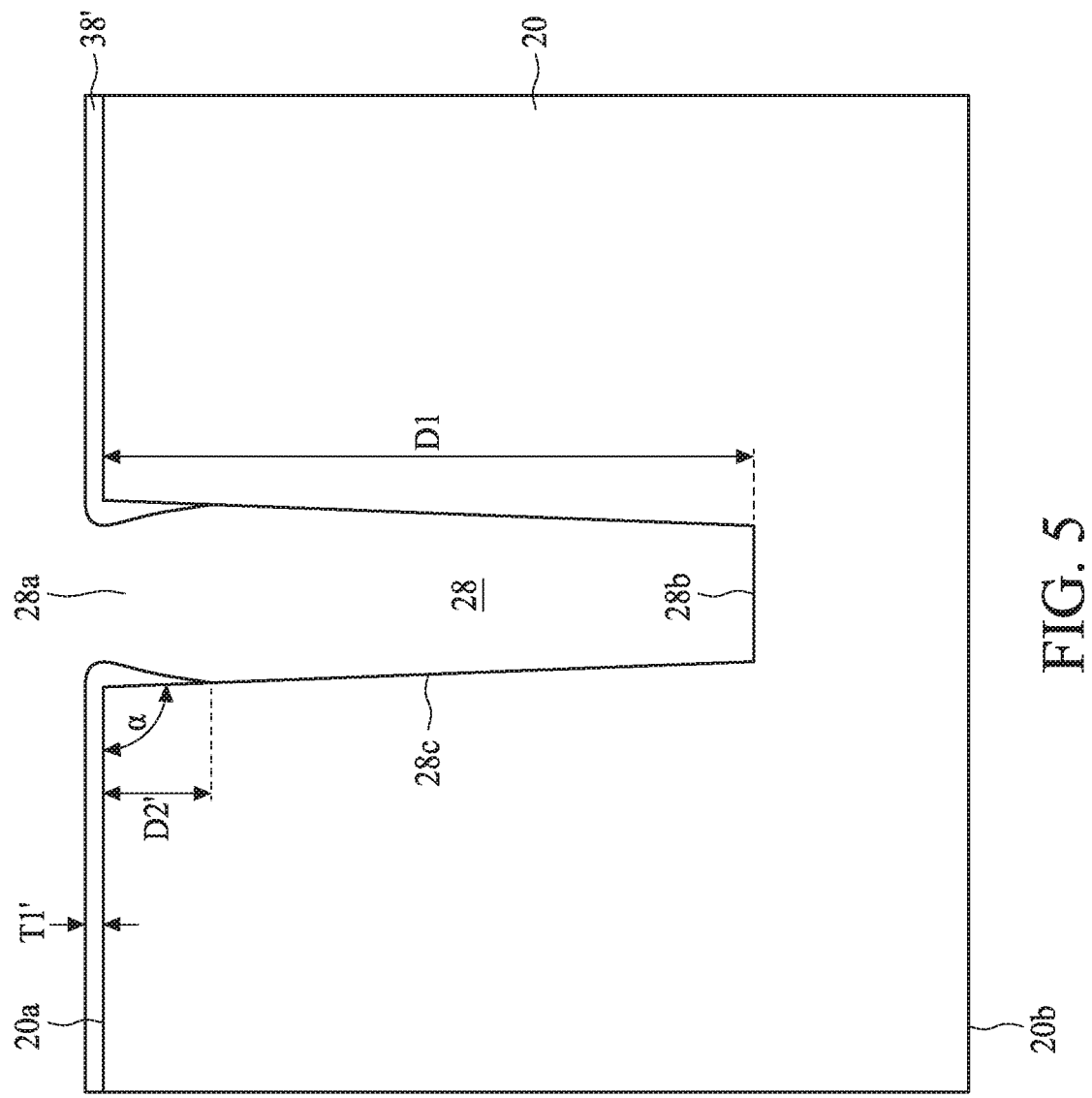

Next, as shown in FIG. 5, an etch process may be performed to remove native oxide materials formed upon the sidewalls 28c of the deep trench 28 during the manufacturing process. The native oxide materials may hinder an epitaxial silicon layer to be directly formed on the sidewalls 28c of the deep trench 28 in the subsequent process because it is easier to deposit the epitaxial silicon layer on the silicon surface compared to on the native oxide materials. The etch process includes a wet etch process, dry etch process, or combination dry and wet etch processes. For example, the wet etch process may include an dip through a dilute solution and/or other suitable etchant solutions of about 10 seconds dip time. In addition to the native oxide materials on the sidewalls 28c, the etch process removes a portion of the oxide layer 38 as well and makes the oxide layer 38 shrink to an oxide layer 38' with a reduced size compared to the oxide layer 38. In some embodiments, a thickness T1' of the oxide layer 38' measured at the horizontal portion of the oxide layer 38' over the front surface 20a of the semiconductor substrate 20 may be about 40% to about 60% of the oxide layer 38. In addition, a depth D2' of the oxide layer 38' from the front surface 20a of the semiconductor substrate 20 to the lowest end of the oxide layer 38' may be about 40% to about 60% of the depth D2. In many instances, the depth D2' may be in a range from about 1500 angstroms to about 3000 angstroms. A ratio D1/D2' may be in a range of about 10 to about 70.

Figure 6:
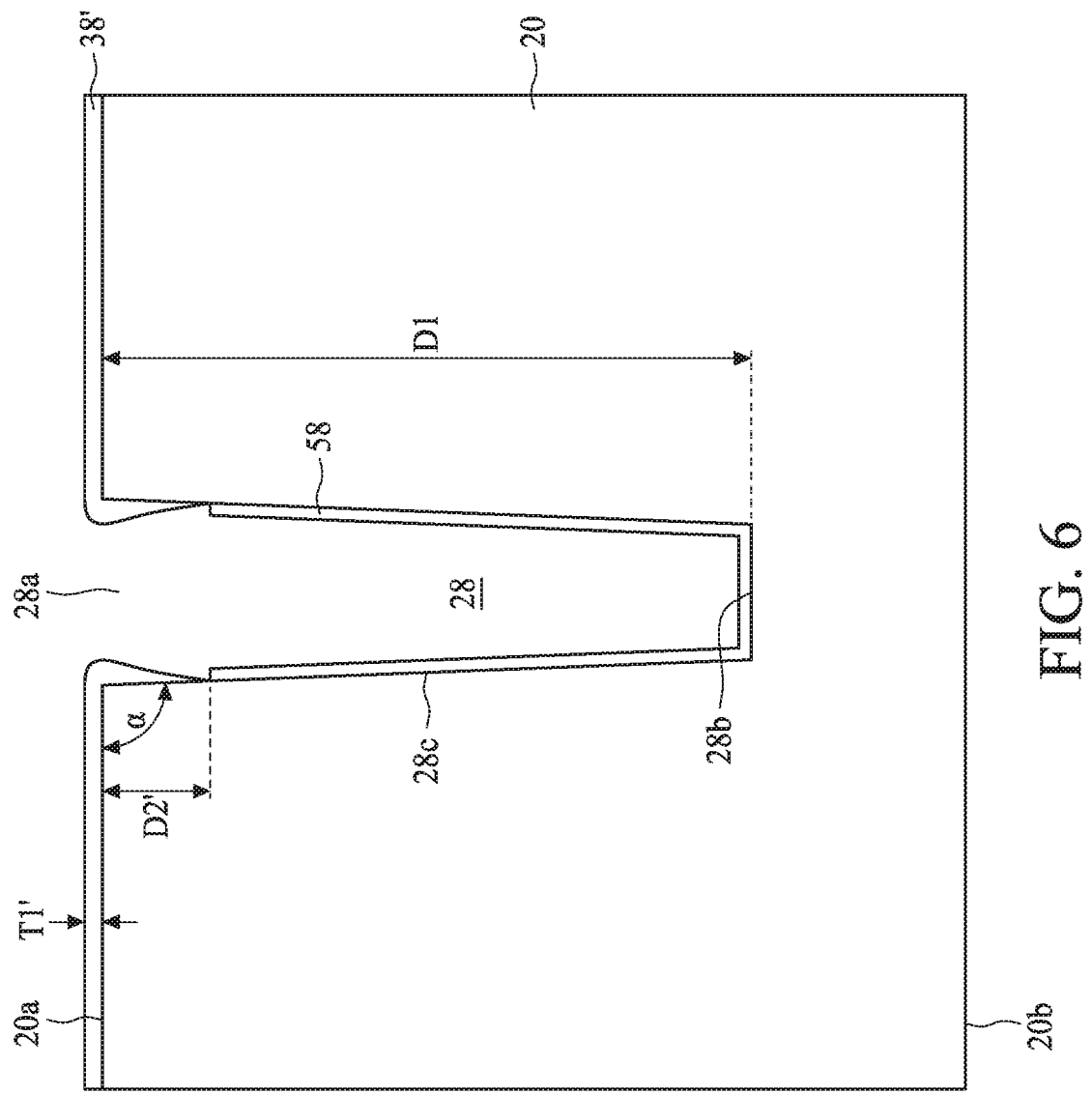

As mentioned above, the epitaxial silicon layer is formed on the sidewalls 28c of the deep trench 28 after the native oxide materials are removed. In particular, as shown in FIG. 6, a boron doped epitaxial layer 58 is formed on the exposed sidewalls 28c of the deep trench 28 after the etch process. Since the boron doped epitaxial layer 58 is unlikely to be directly deposited on the oxide layer 38', the boron doped epitaxial layer 58 may be directly formed on the bottom 28b and a portion of the sidewalls 28c which is not covered by the oxide layer 38'. in other words, the boron doped epitaxial layer 58 may immediately abut the lowest end of the oxide layer 38' and not overlap with the oxide layer 38'. The boron doped epitaxial layer 58 may be conformally deposited as shown in the cross-sectional view of FIG. 6. In some embodiments, a thickness of the boron doped epitaxial layer 58 may in a range of about 100 angstroms to about 200 angstroms. However, this is not a limitation of the present disclosure.

Figure 7:
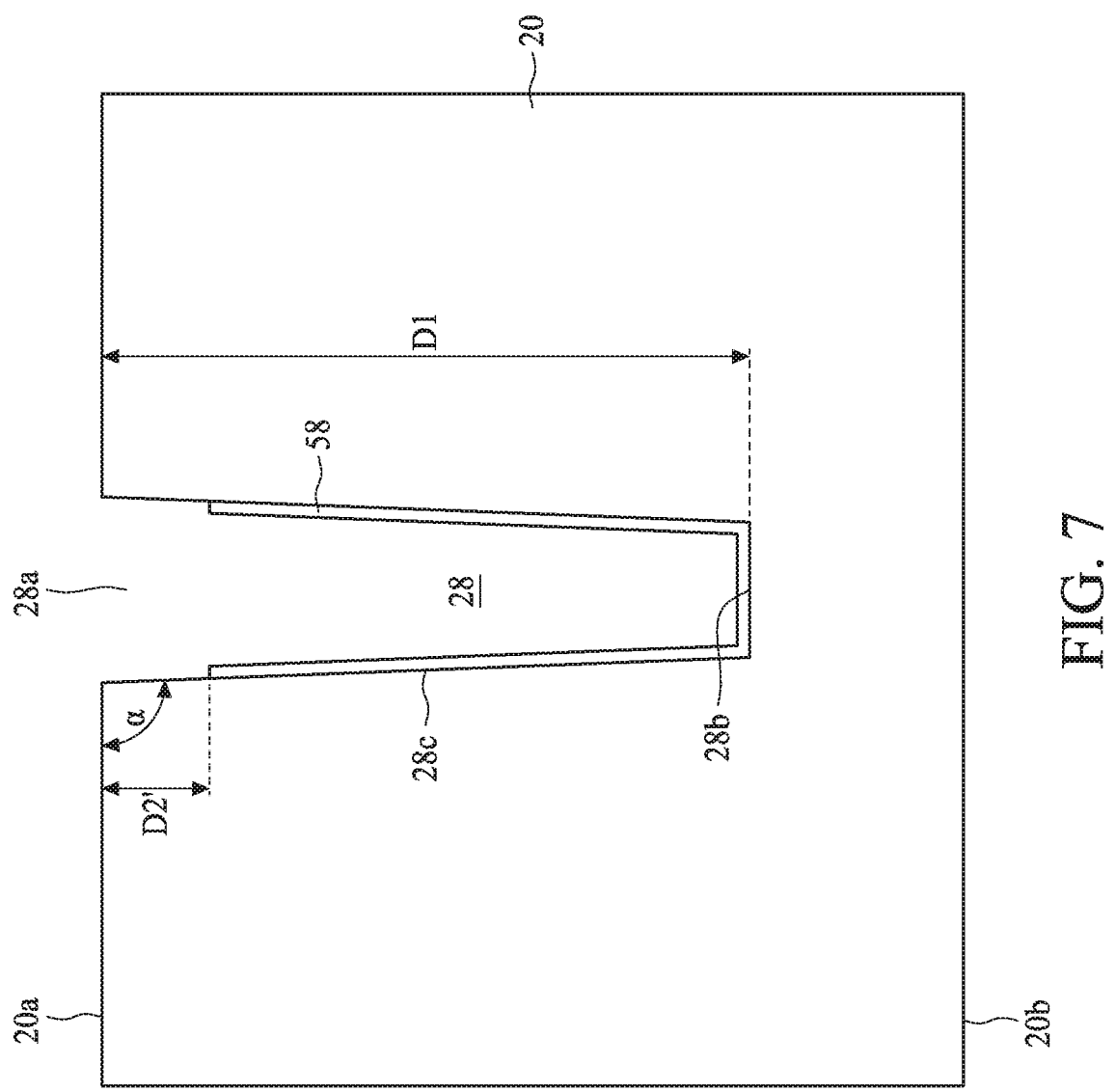

After the boron doped epitaxial layer 58 is formed, the oxide layer 38' may be removed through an etch process substantially the same or similar to the etch process performed above, thereby removing the native oxide materials on the sidewalls 28c of the deep trench 28. In some embodiments, the etch process may include an HF dip through a dilute HF solution and/or other suitable etchant solutions. After the oxide layer 38' are removed from the front surface 20a of the semiconductor substrate 20 and a portion of the sidewalls 28c of the deep trench 28, these regions originally covered by the oxide layer 38' can be exposed as shown in FIG. 7.

Figure 8:
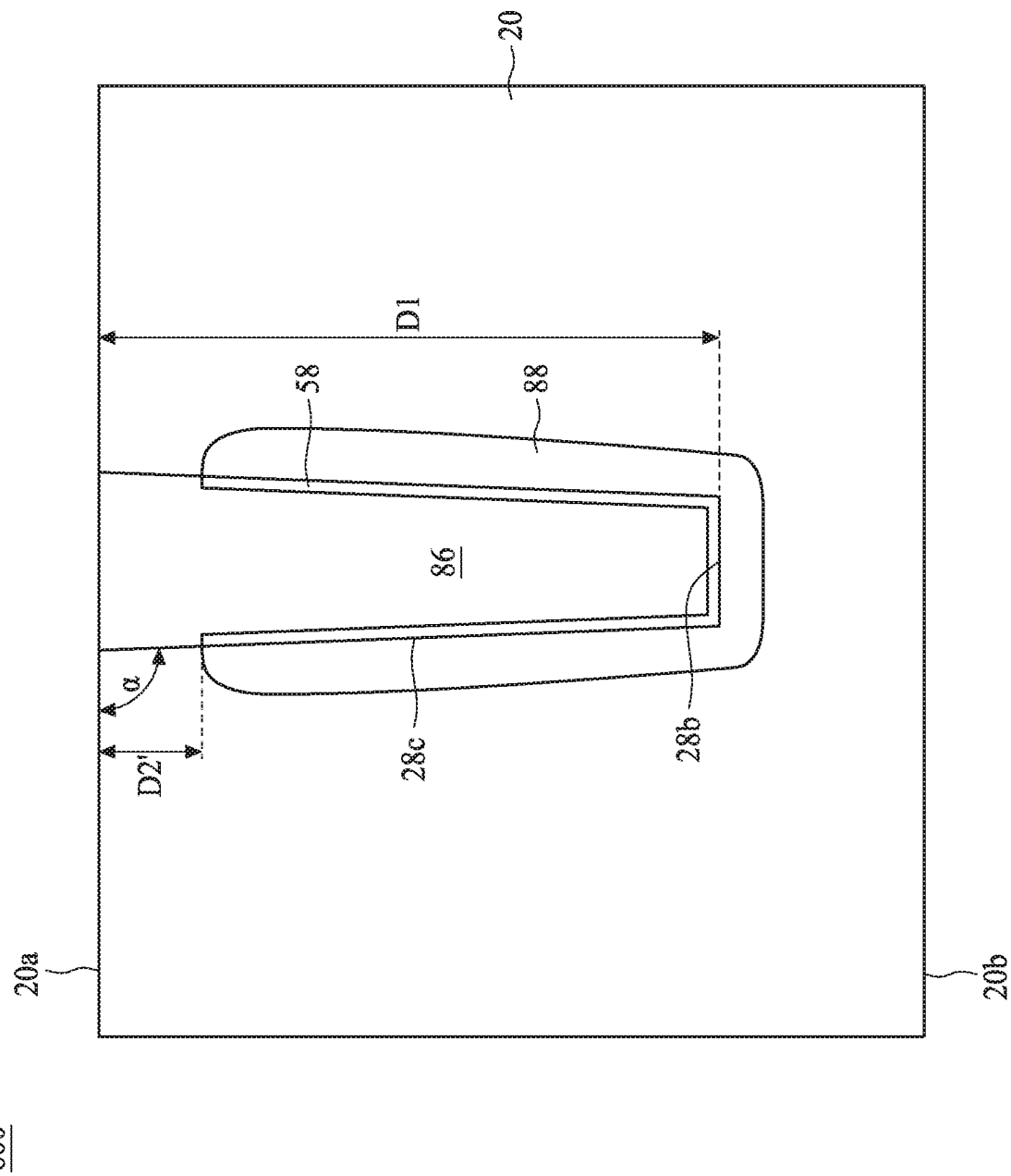

In FIG. 8, the deep trench 28 is filled with a filling material 86 in order to form a DTI structure between adjacent photosensitive regions (such as photosensitive regions 110 of FIG. 18) formed within the semiconductor substrate 20. The filling material 86 may be opaque to the incident radiation and absorb or reflect the incident radiation in order to mitigate against optical crosstalk. The filling material 86 may be non-conductive in order to provide electrical isolation for reducing dark current. In many instances, the filling material 86 may include oxide such as silicon oxide (SiO$_2$). An upper portion of the oxide 86 may be in contact with an upper portion of the sidewalls 28c of the deep trench 28, and a lower portion of the oxide 86 may be in contact with the boron doped epitaxial layer 58. During the oxide filling process, the boron of the boron doped epitaxial layer 58 may be gradually diffused from the boron doped epitaxial layer 58 to neighboring regions 88 of the semiconductor substrate 20. In this way, a graded transition of doped boron is therefore formed. In particular, the boron doping concentration is gradually reduced from the boron doped epitaxial layer 58 to the neighboring regions 88, and the boron doping concentration is close to zero at outermost of the neighboring regions 88. After the filling process, the front surface 20a of the semiconductor substrate 20 is subjected to a planarization process (such as a CMP) to remove excess filling material 86, resulting in the DTI structure 800 of the first embodiment.

Figure 9:
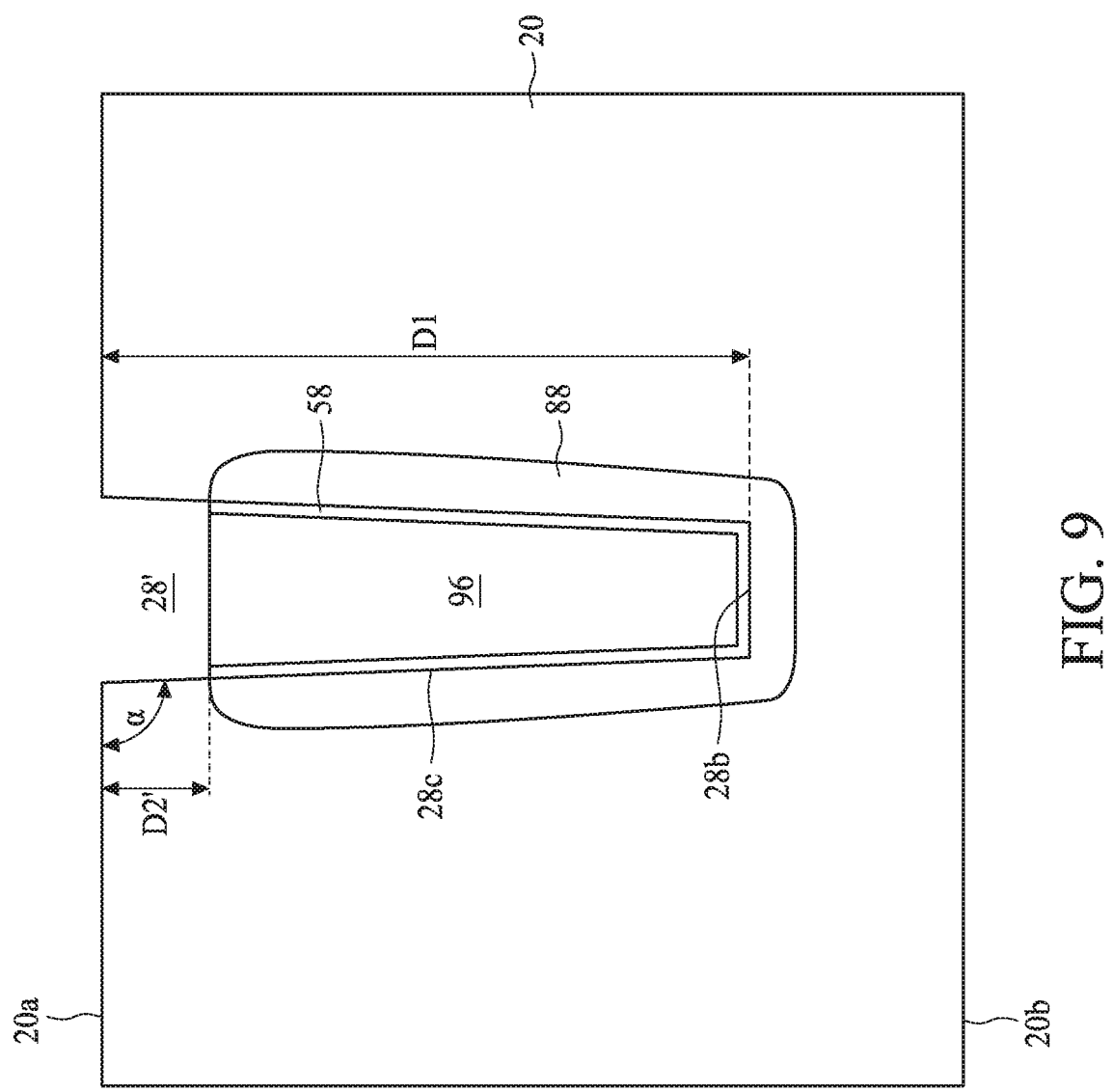
Figure 10:
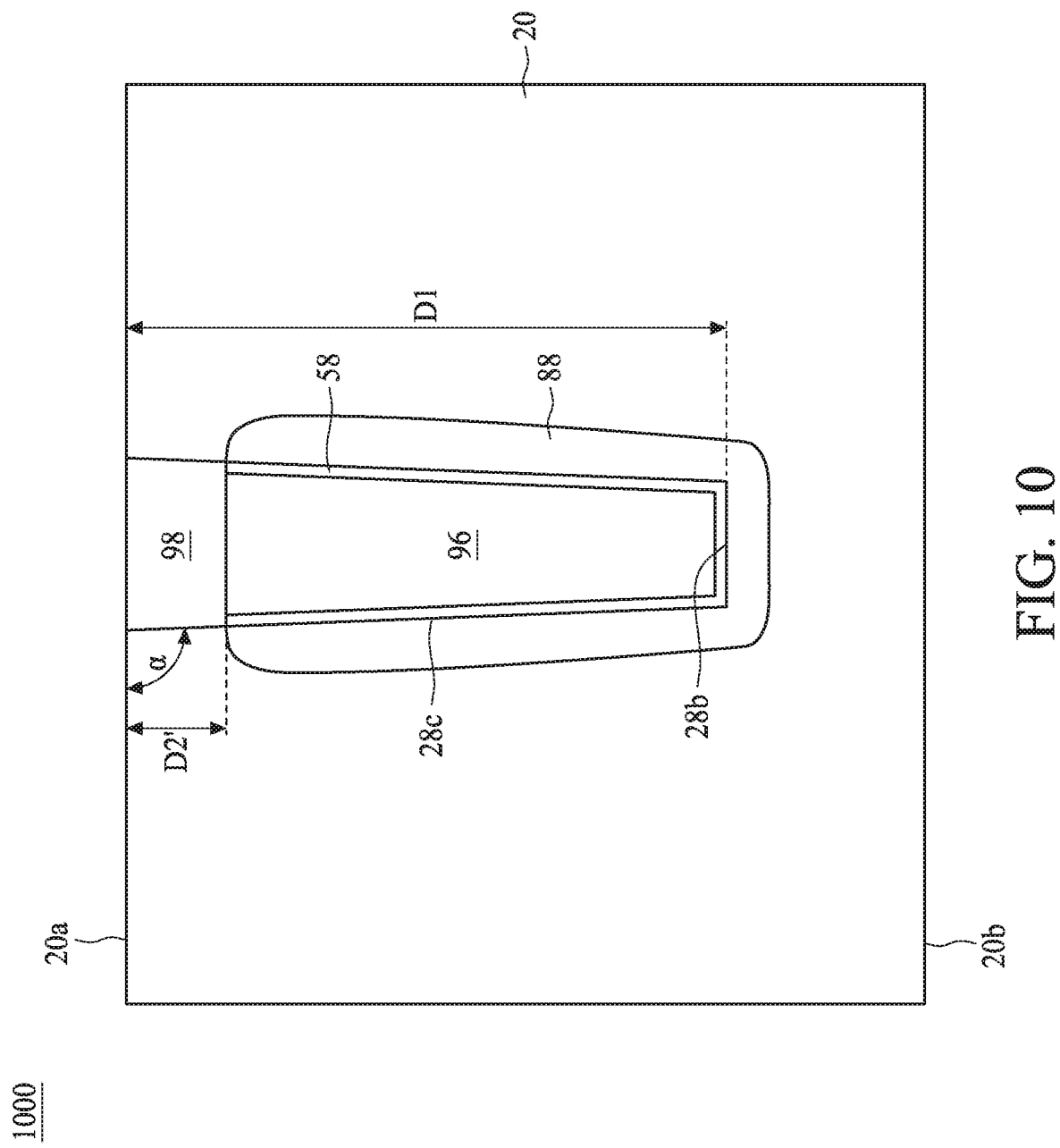

Alternatively, the process of FIG. 8 may be replaced with the process of FIG. 9 to FIG. 10 in accordance with a second embodiment of the present disclosure. In FIG. 9, the deep trench 28 is filled with a filling material 96 different from the filling material 86 of FIG. 8. In an exemplary embodiment, the filling material 96 may include polysilicon material. As shown in FIG. 9, the polysilicon 96 may be etched back to a level around a top end of the boron doped epitaxial layer 58. In other words, a depth of the etch process may be about D2'. A shallow trench 28' is therefore produced. In accordance with some exemplary embodiments, the etch process is performed through a dry etch method including, and not limited to, Inductively Coupled Plasma (ICP), Transformer Coupled Plasma (TCP), Electron Cyclotron Resonance (ECR), Reactive Ion Etch (RIE), and the like. The process gases include, for example, fluorine-containing gases (such as SF$_6$, CF$_4$, CHF$_3$, NF$_3$), Chlorine-containing gases (such as Cl$_2$), Br$_2$, HBr, BCl$_3$ and/or the like. During the polysilicon filling process, the boron of the boron doped epitaxial layer 58 may be gradually diffused from the boron doped epitaxial layer 58 to neighboring regions 88 of the semiconductor substrate 20 in a way substantially the same or similar to FIG. 8.

In FIG. 10, the shallow trench 28' is filled with a filing material 98 different from the polysilicon 96. In many instances, the filling material 98 may be substantially the same or similar to the filling material 86 (i.e. the filling material 98 may include oxide). The oxide 98 may be in contact with an upper portion of the sidewalls 28c of the deep trench 28, and the polysilicon 96 may be in contact with the boron doped epitaxial layer 58. After the filling process, the front surface 20a of the semiconductor substrate 20 is subjected to a planarization process (such as a CMP) to remove excess filling material 98, resulting in the DTI structure 1000 of the first embodiment.

Figure 11:
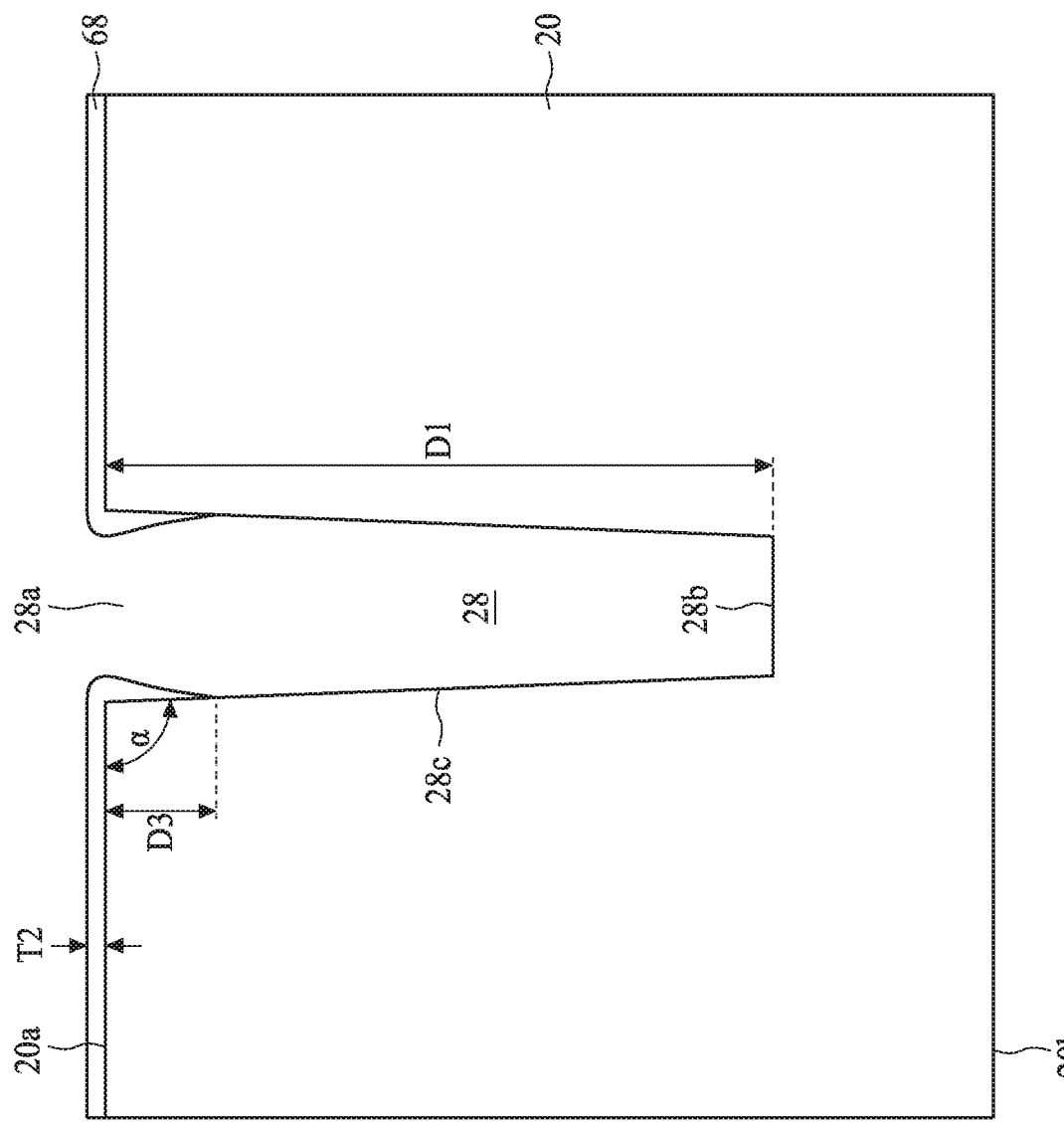

Alternatively, the process of FIG. 4 to FIG. 10 may be replaced with the process of FIG. 11 to FIG. 15 in accordance with a third embodiment of the present disclosure. FIG. 11 illustrates the formation of a nitride layer 68. In accordance with some embodiments of the present disclosure, the nitride layer 68 may be comprised of silicon nitride (SiN), and the nitride layer 68 may be deposited through a low deposition rate process such as Plasma Enhanced Chemical Vapor Deposition (PECVD) or the like. The nitride layer 68 may be deposited to cover the front surface 20a of the semiconductor substrate 20 and further extend into the deep trench 28 to cover at least a portion of the sidewalls 28c of the deep trench 28. The nitride layer 68 may be non-conformal and may form an overhang shape around the opening 28a of the deep trench 28. A thickness T2 of the nitride layer 68 measured at the horizontal portion of the nitride layer 68 over the front surface 20a of the semiconductor substrate 20 may be in the range between about 80 angstroms and about 500 angstroms. A thickness of the nitride layer 68 covering the sidewalls 28c of the deep trench 28 may gradually reduce from the opening 28a of the deep trench 28 toward the bottom surface 28b of the deep trench 28, as shown in FIG. 11. In some embodiments, the nitride layer 68 extends to a depth D3 from the front surface 20a of the semiconductor substrate 20. The depth D3 may be in a range from about 1500 angstroms to about 3000 angstroms.

Figure 12:
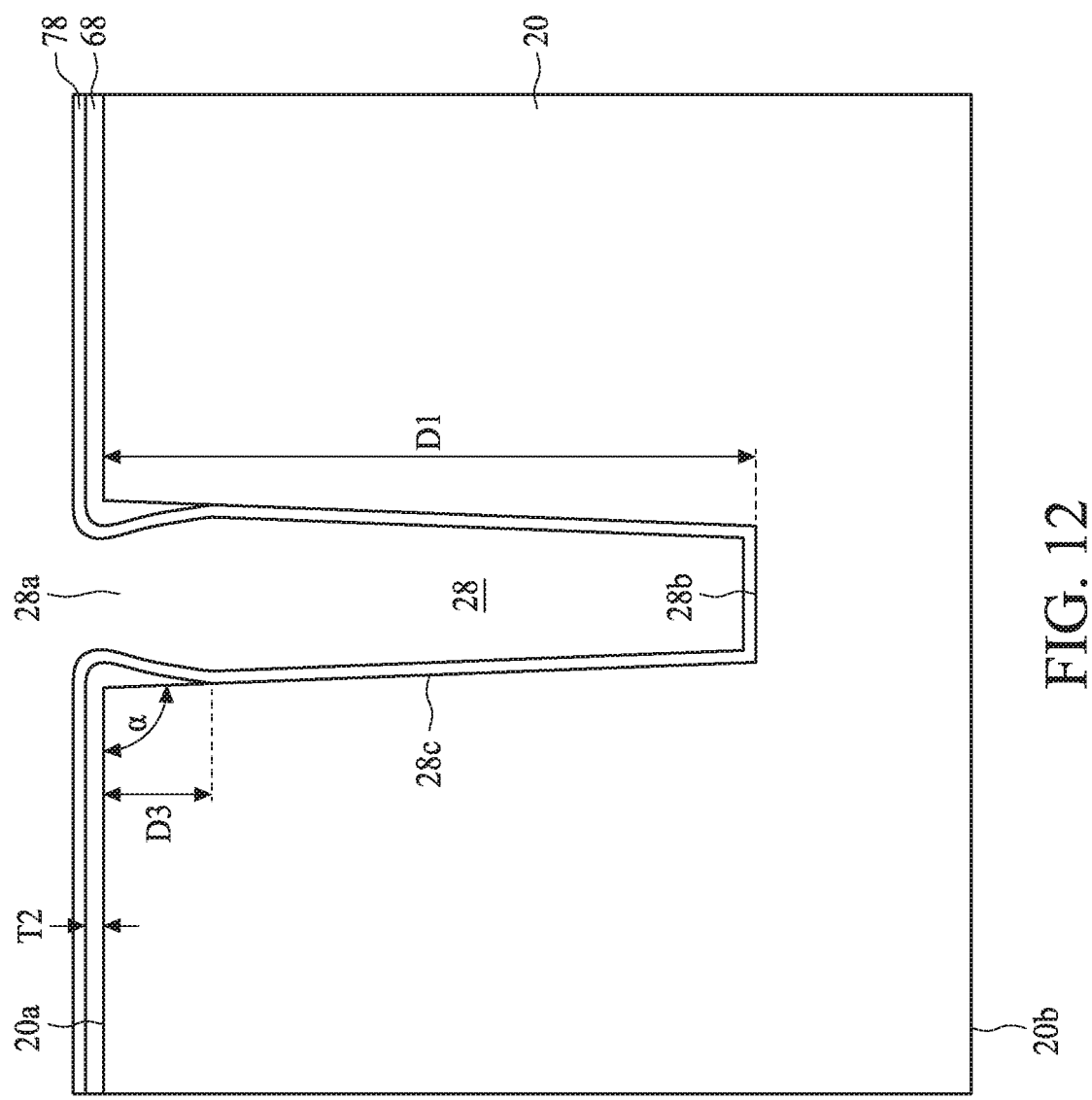
Figure 13:
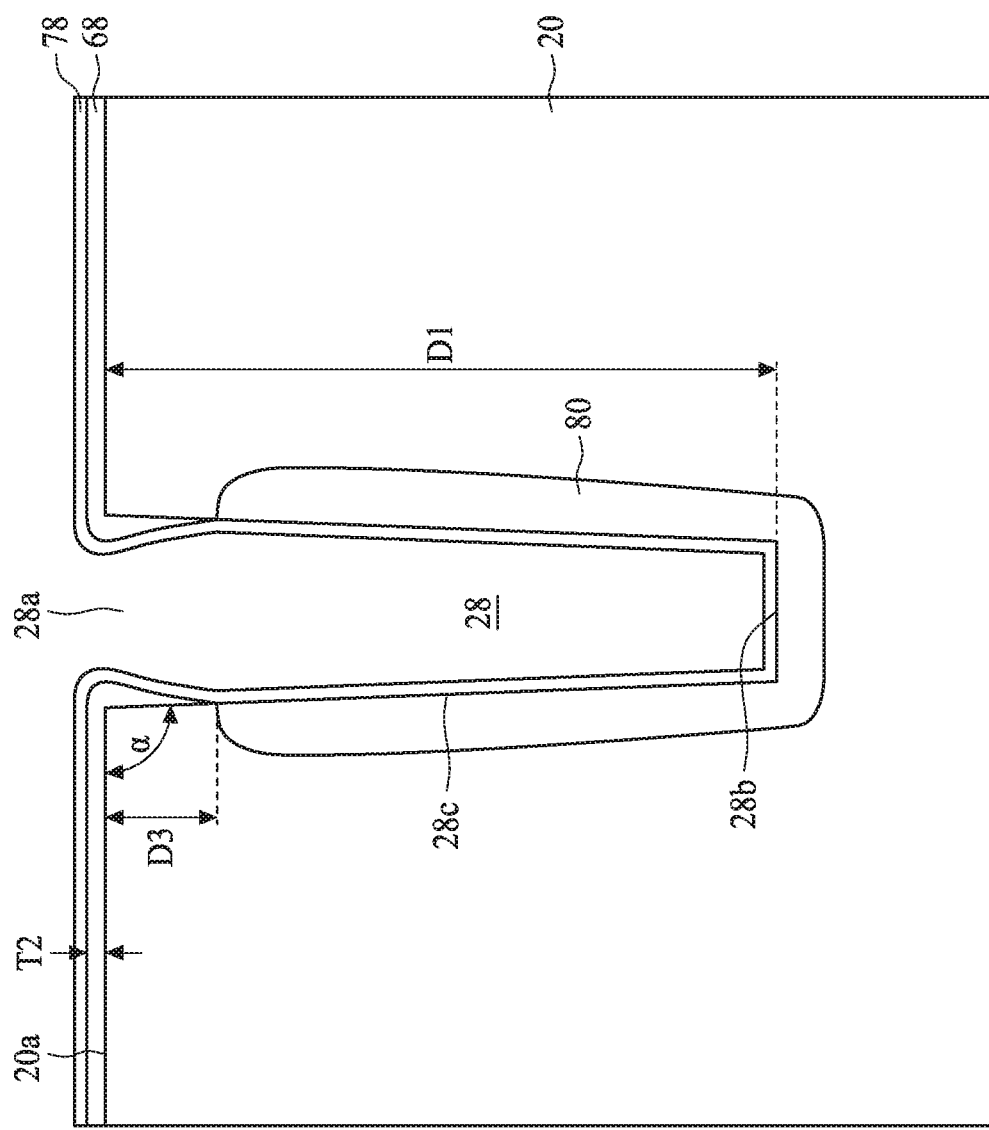

Next, a boron-doped plasma enhanced atomic layer deposition (B:PEALD) may be performed upon the semiconductor substrate 20 to conformally form a boron-doped layer 78 on the nitride layer 68, the sidewalls 28c and bottom surface 28b of the deep trench 28 as shown in FIG. 12. In some embodiments, the B:PEALD may be replaced with an implant process or a plasma doping process. A drive-in process is then performed whereby boron in the boron-doped layer 78 diffuses by thermal activation to neighboring regions 80 of the semiconductor substrate 20 as shown in FIG. 13. In this way, a graded transition of doped boron is therefore formed. In particular, the boron doping concentration is gradually reduced from the boron-doped layer 78 to the neighboring regions 80, and the boron doping concentration is close to zero at outermost of the neighboring regions 80. Because the boron does not penetrate the nitride layer 68, a top of the neighboring regions 80 is substantially below the front surface 20a of the semiconductor substrate 20 by the depth D3.

Figure 14:
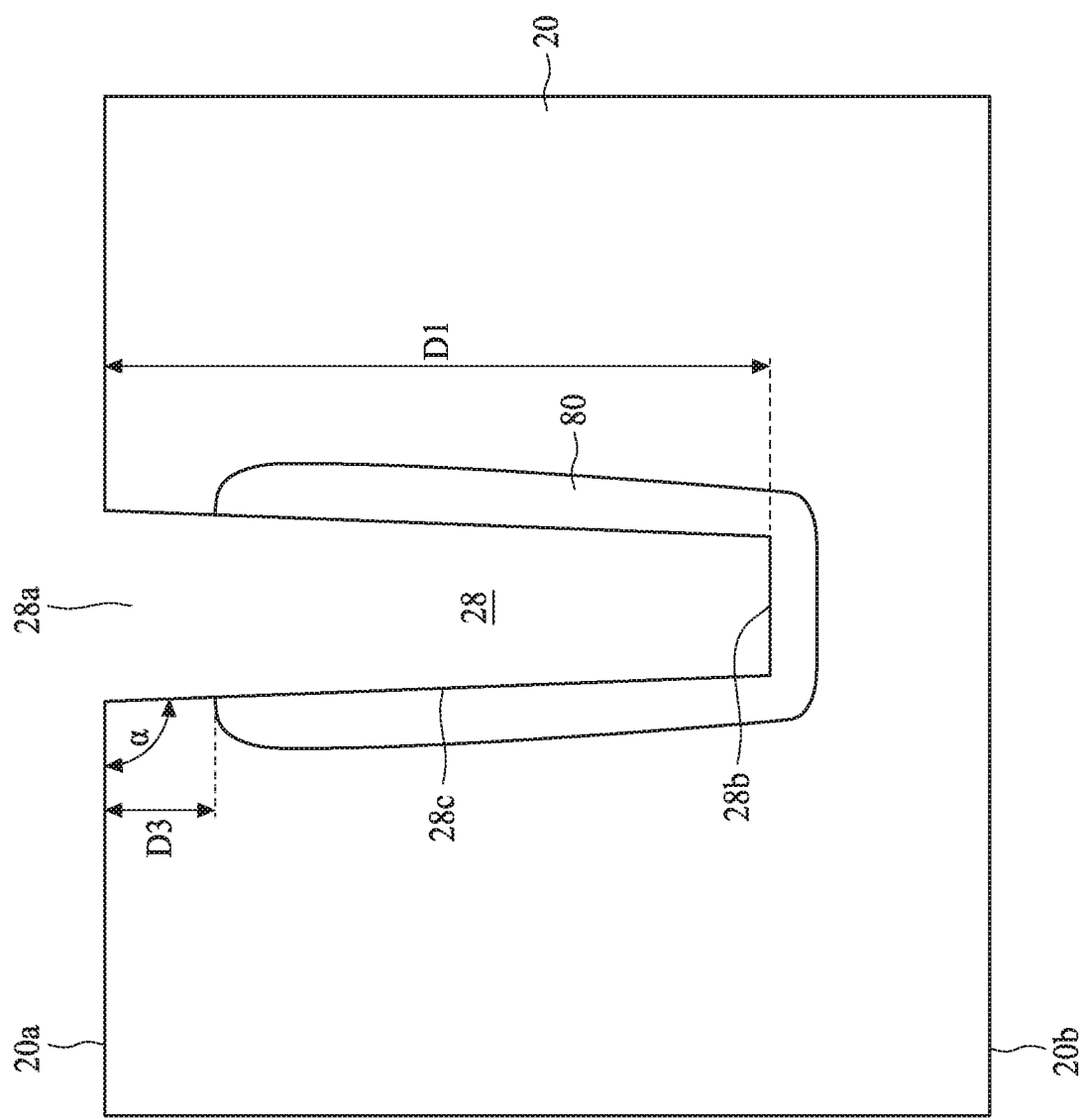

After the drive-in process, the boron-doped layer 78 and the nitride layer 68 may be removed through an etch process substantially the same or similar to the etch process performed above for removing the native oxide materials on the sidewalk 28c of the deep trench 28. In some embodiments, the etch process may include an $HF/H_3PO_4$ dip through a dilute $HF/H_3PO_4$ solution and/or other suitable etchant solutions. After the boron-doped layer 78 and the nitride layer 68 are removed from the front surface 20a of the semiconductor substrate 20 and the sidewalls 28c of the deep trench 28, these regions originally covered by the boron-doped layer 78 and the nitride layer 68 can be exposed as shown in FIG. 14.

Figure 15:
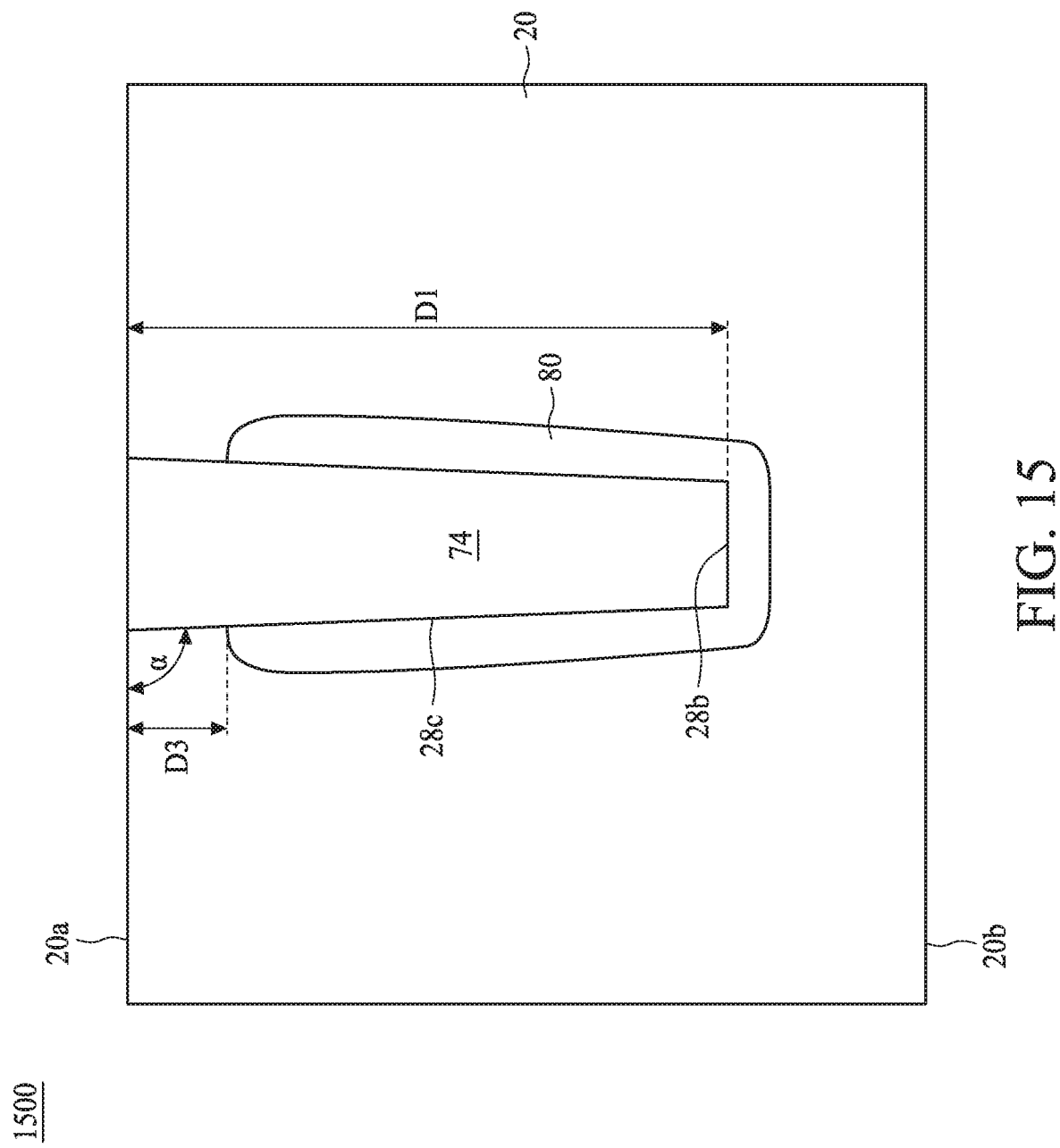

In FIG. 15, the deep trench 28 is filled with a filling material 74 in order to form a boundary between adjacent photosensitive regions (such as photosensitive regions 110 of FIG. 18) formed within the semiconductor substrate 20. In many instances, the filling material 74 may include oxide, such as silicon oxide ($SiO_2$). After the filling process, the front surface 20a of the semiconductor substrate 20 is subjected to a planarization process (such as a CMP) to remove excess filling material 74, resulting in the DTI structure 1500 of the third embodiment.

Figure 16:
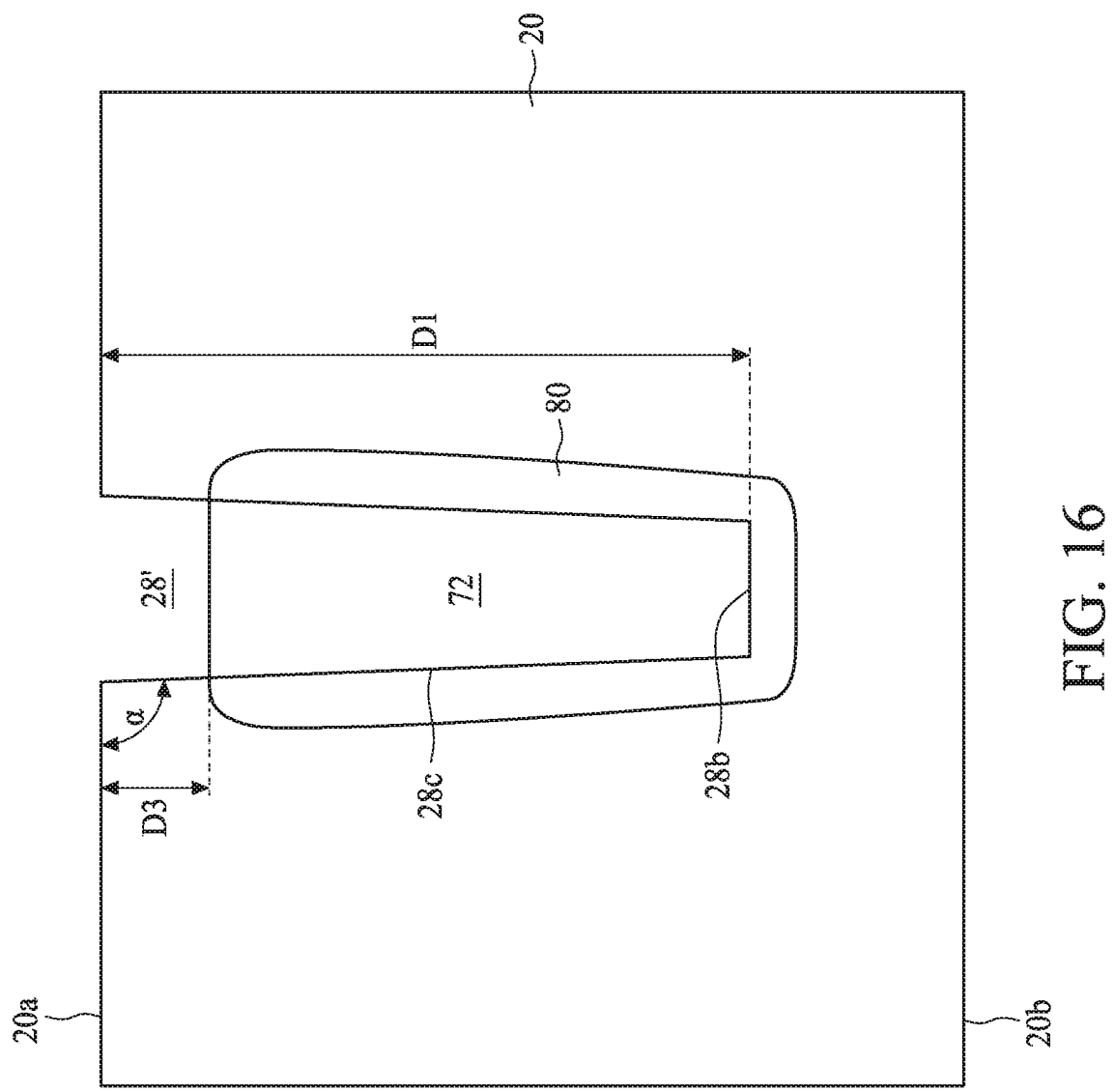
Figure 17:
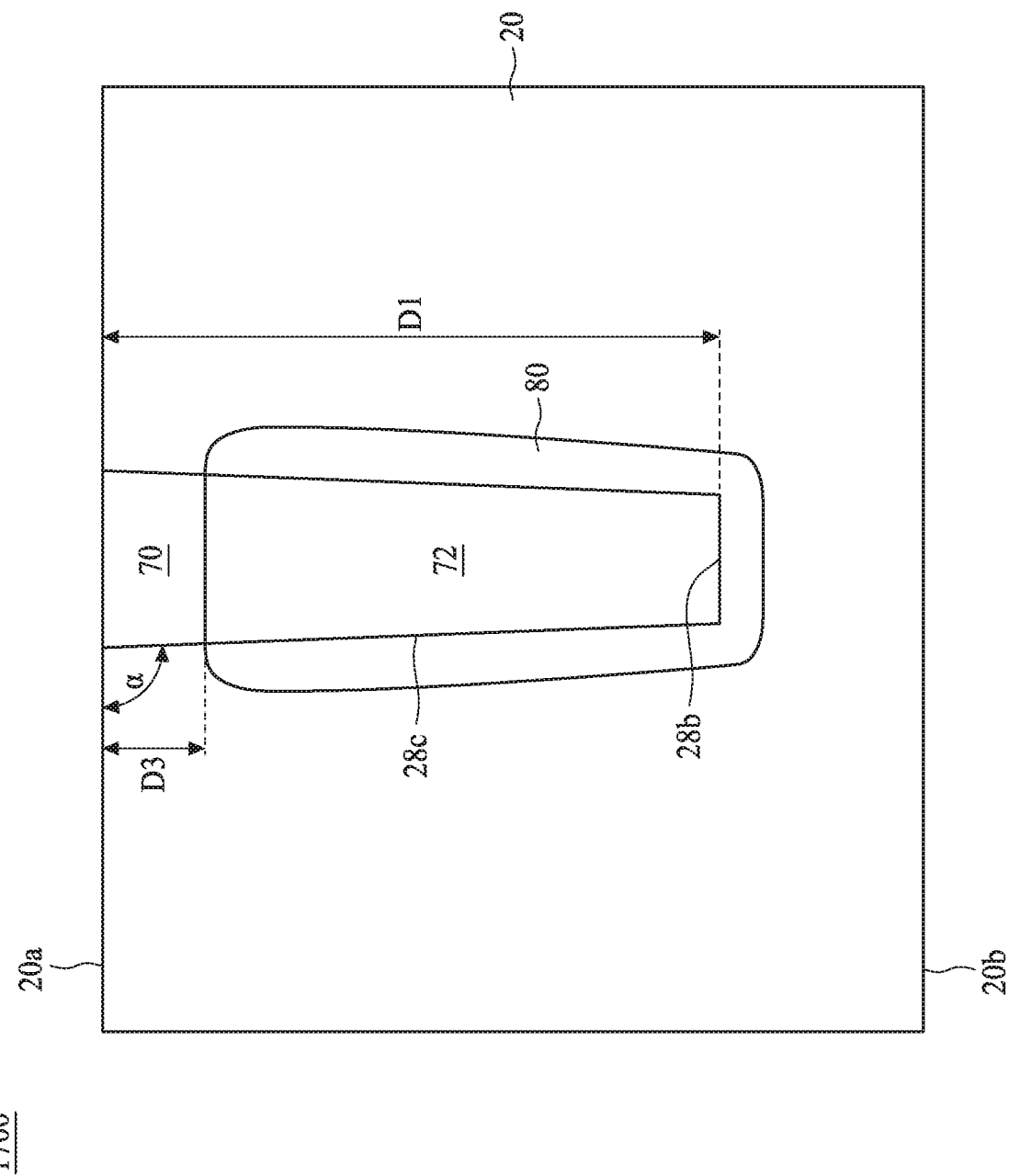

Alternatively, the process of FIG. 15 may be replaced with the process of FIG. 16 to FIG. 17 in accordance with a fourth embodiment of the present disclosure. In FIG. 16, the deep trench 28 is filled with a filling material 72 different from the filling material 74 of FIG. 15. In an exemplary embodiment, the filling material 72 may include polysilicon material. As shown in FIG. 16, the polysilicon 72 may be etched back to a level around a top end of the neighboring regions 80, in other words, a depth of the etch process may be about D3. A shallow trench 28' is therefore produced. In accordance with some exemplary embodiments, the etch process is performed through a dry etch method.

In FIG. 17, the shallow trench 28' is filled with a tilling material 70 different from the polysilicon 72. In many instances, the filling material 70 may be substantially the same or similar to the filling material 74 (i.e. the filling material 70 may include oxide). The oxide 70 may be in contact with an upper portion of the sidewalls 28c of the deep trench 28, and the polysilicon 72 may be in contact with the neighboring regions 80. After the filling process, the front surface 20a of the semiconductor substrate 20 is subjected to a planarization process (such as a CMP) to remove excess filling material 70, resulting in the DTI structure 1700 of the fourth embodiment.

Figure 18:
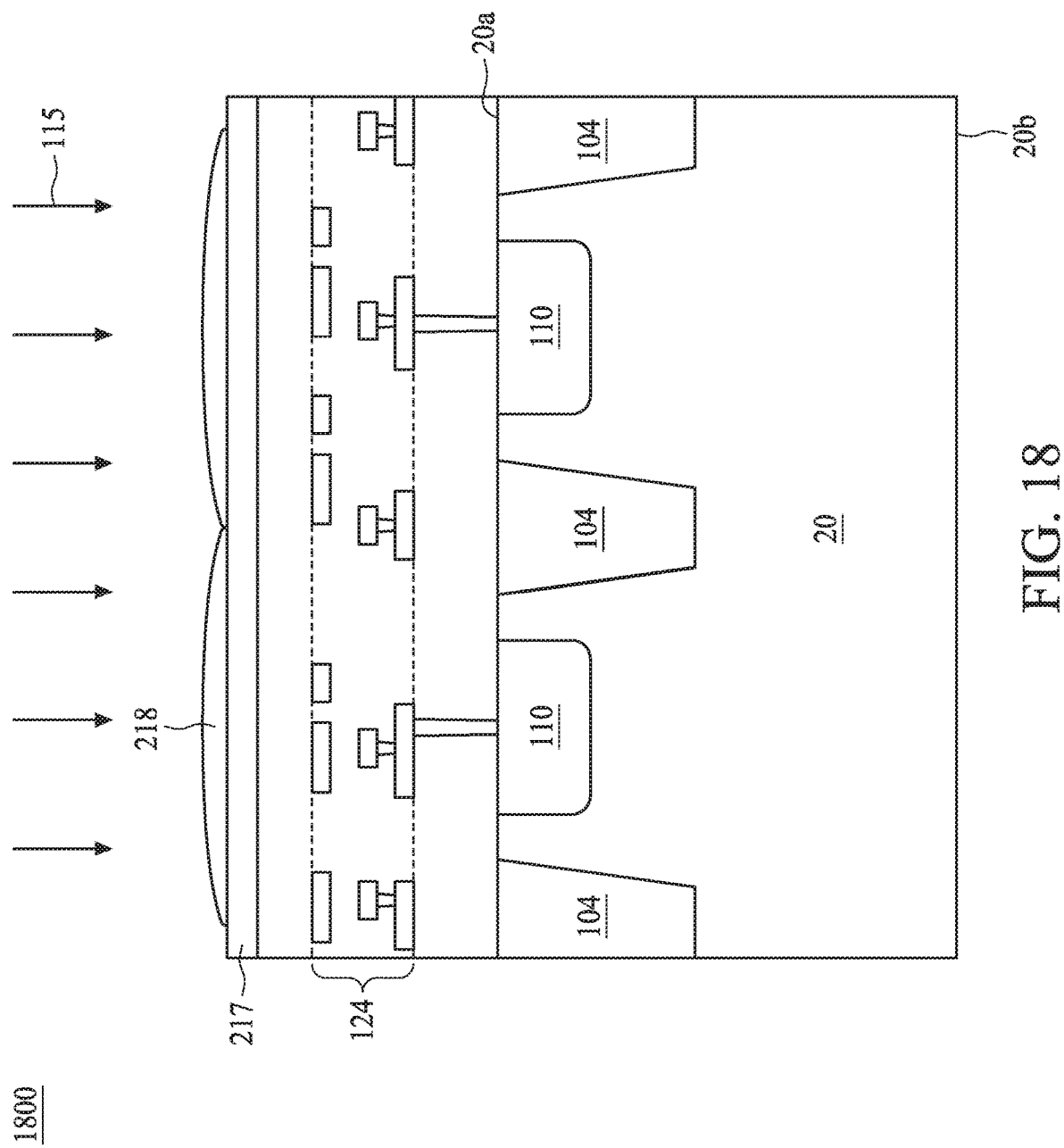
FIG. 18 illustrates the cross-sectional views of an FSI image sensor chip in accordance with various embodiments of the present disclosure.

FIG. 18 illustrates the cross-sectional views of an FSI image sensor chip 1800 in accordance with various embodiments of the present disclosure. Referring to FIG. 18, the FSI image sensor chip 1800 includes photosensitive regions 110. Adjacent photosensitive regions 110 are separated by DTI structures 104. The DTI structures 104 extend from the front surface 20A of semiconductor substrate 20 into semiconductor substrate 20. In the FSI image sensor chip 1800, interconnect structure 124 may be formed over photosensitive regions 110 and DTI structures 104, and includes a plurality of metal lines and vias in a plurality of dielectric layers. Color filters 217 and micro-lenses 218 may be formed over interconnect structure 124, and are aligned to photosensitive regions 110 respectively. In the FSI image sensor chip 1800, light 115 is projected to photosensitive regions 110 from the front surface 20a. The DTI structures 104 may include the DTI structures 800, 1000, 1500 or 1700 in accordance with various embodiments of the present disclosure.

Some embodiments of the present disclosure provide a semiconductor structure. The semiconductor structure includes: a semiconductor substrate having a front surface and a back surface facing opposite to the front surface; a filling material extending from the front surface into the semiconductor substrate without penetrating through the semiconductor substrate, the filling material including an upper portion and a lower portion, the upper portion being in contact with the semiconductor substrate; and an epitaxial layer lined between the lower portion of the filling material and the semiconductor substrate.

Some embodiments of the present disclosure provide a semiconductor structure. The semiconductor structure includes: a semiconductor substrate having a first surface and a second surface facing opposite to the first surface; an isolation structure extending from the first surface into the semiconductor substrate without penetrating through the semiconductor substrate, the isolation structure including an upper portion and a lower portion, the upper portion and the lower portion being in contact with the semiconductor substrate; and a region having graded transition of doping concentration in the semiconductor substrate abutting the lower portion of the isolation structure and free from abutting the upper portion of the isolation structure.

Some embodiments of the present disclosure provide a method of manufacturing a semiconductor structure. The method includes: etching a semiconductor substrate to form a trench extending from a front surface of the semiconductor substrate into the semiconductor substrate; depositing an oxide layer on the semiconductor substrate to cover the front surface and a portion of sidewalls of the trench; depositing an epitaxial layer on the exposed sidewalls of the trench; removing the oxide layer; and filling a filling material in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a semiconductor substrate having a front surface and a back surface facing opposite to the front surface;
a filling material extending from the front surface into the semiconductor substrate without penetrating through the semiconductor substrate, the filling material including an upper portion and a lower portion, the upper portion being in contact with the semiconductor substrate; and
a region having graded transition of doping concentration in the semiconductor substrate encompassing the lower portion of the filling material and free from abutting the upper portion of the filling material, the region includes an epitaxial layer lined encompassing the lower portion of the filling material.

2. The semiconductor structure of claim 1, wherein the epitaxial layer comprises boron, and the region further includes graded transition of boron doping concentration in the semiconductor substrate abutting the epitaxial layer.

3. The semiconductor structure of claim 1, wherein an aspect ratio of a cross-sectional view of the filling material is in a range of about 20 to about 100.

4. The semiconductor structure of claim 1, wherein a ratio of a depth of the filling material to a depth of the upper portion of the filling material is in a range of about 10 to about 70.

5. The semiconductor structure of claim 1, wherein the upper portion of the filling material includes a first filling material, and the lower portion of the filling material includes a second filling material different from the first filling material.

6. The semiconductor structure of claim 5, wherein the first filling material includes oxide, and the second filling material includes polysilicon.

7. The semiconductor structure of claim 1, wherein the upper portion of the filling material includes a first filling material, and the lower portion of the filling material includes a second filling material substantially the same to the first filling material.

8. The semiconductor structure of claim 7, wherein the first filling material and the second filling material include oxide.

9. The semiconductor structure of claim 1, wherein the semiconductor structure further comprises:
a first photosensitive region and a second photosensitive region formed in the semiconductor substrate abutting the front surface;
a micro-lenses over the front surface; and
an interconnect structure over the front surface between the micro-lenses and the front surface;
wherein the filling material is between the first photosensitive region and the second photosensitive region.

10. A semiconductor structure, comprising:
a semiconductor substrate having a first surface and a second surface facing opposite to the first surface;
an isolation structure extending from the first surface into the semiconductor substrate without penetrating through the semiconductor substrate, the isolation structure including an upper portion and a lower portion, the upper portion being in contact with the semiconductor substrate; and
a region having graded transition of doping concentration in the semiconductor substrate encompassing the lower portion of the isolation structure and free from abutting the upper portion of the isolation structure.

11. The semiconductor structure of claim 10, wherein the region has graded transition of boron doping concentration.

12. The semiconductor structure of claim 10, wherein an aspect ratio of a cross-sectional view of the isolation structure is in a range of about 20 to about 100.

13. The semiconductor structure of claim 10, wherein a ratio of a depth of a bottom of the isolation structure to a depth of a bottom of the upper portion of the isolation structure is in a range of about 10 to about 70.

14. The semiconductor structure of claim 10, wherein the upper portion of the isolation structure includes a first material, and the lower portion of the isolation structure includes a second material different from the first material.

15. The semiconductor structure of claim 14, wherein the first material includes oxide, and the second material includes polysilicon.

16. The semiconductor structure of claim 10, wherein the upper portion of the isolation structure includes a first material, and the lower portion of the isolation structure includes a second material substantially the same to the first material.

17. The semiconductor structure of claim 16, wherein the first material and the second material include oxide.

18. A semiconductor structure, comprising:
a semiconductor substrate having a front surface and a back surface facing opposite to the front surface;
a filling material extending from the front surface into the semiconductor substrate without penetrating through the semiconductor substrate;
a doped epitaxial layer at least lined between a bottom of the filling material and the semiconductor substrate; and a region having graded transition of doping concentration in the semiconductor substrate encompassing the epitaxial layer;

wherein the doped epitaxial layer and the region together form a region having graded transition of doping concentration in the semiconductor substrate encompassing a lower portion of the filling material and free from abutting an upper portion of the filling material.

19. The semiconductor structure of claim 18, wherein the doped epitaxial layer comprises boron.

20. The semiconductor structure of claim 18, wherein an aspect ratio of a cross-sectional view of the filling material is in a range of about 20 to about 100.

* * * * *